United States Patent
Lei et al.

(10) Patent No.: US 11,035,039 B2
(45) Date of Patent: Jun. 15, 2021

(54) COMPOSITIONS AND METHODS FOR DEPOSITING SILICON NITRIDE FILMS

(71) Applicant: Versum Materials US, LLC, Tempe, AZ (US)

(72) Inventors: Xinjian Lei, Vista, CA (US); Moo-Sung Kim, Gyunggi-Do (KR); Manchao Xiao, San Diego, CA (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 274 days.

(21) Appl. No.: 15/745,275

(22) PCT Filed: Jul. 28, 2016

(86) PCT No.: PCT/US2016/044472
§ 371 (c)(1),
(2) Date: Jan. 16, 2018

(87) PCT Pub. No.: WO2017/023693
PCT Pub. Date: Feb. 9, 2017

(65) Prior Publication Data
US 2019/0085451 A1 Mar. 21, 2019

Related U.S. Application Data

(60) Provisional application No. 62/199,593, filed on Jul. 31, 2015.

(51) Int. Cl.
C23C 16/455 (2006.01)
C23C 16/34 (2006.01)
H01L 21/02 (2006.01)

(52) U.S. Cl.
CPC ...... *C23C 16/45553* (2013.01); *C23C 16/345* (2013.01); *C23C 16/45542* (2013.01);
(Continued)

(58) Field of Classification Search
None
See application file for complete search history.

(56) References Cited

U.S. PATENT DOCUMENTS 4,310,477 A * 1/1982 Uy ................. C04B 35/593
264/320
6,391,803 B1 5/2002 Kim et al.
(Continued)

FOREIGN PATENT DOCUMENTS

| EP | 0 394 054 A1 | 10/1990 |
| WO | 2012026464 A1 | 3/2012 |
| WO | 2015/105350 | 7/2015 |

OTHER PUBLICATIONS

Bartholmei "Two Ways to Si-functional Cyclosilanes—Crystal Structure of 1,3,6,8,10,12-Hexa-aza-2,4,5,7,9,11-hexasila-dispiro [4.1.4.1]dodecan" 2004 Eng abst.*
(Continued)

*Primary Examiner* — Mandy C Louie
(74) *Attorney, Agent, or Firm* — David K. Benson (57) ABSTRACT

Described herein are compositions, silicon nitride films and methods for forming silicon nitride films using at least on cyclodisilazane precursor. In one aspect, there is provided a method of forming a silicon nitride film comprising the steps of: providing a substrate in a reactor; introducing into the reactor an at least one cyclodisilazane comprising a hydrocarbon leaving group and two Si—H groups wherein the at least one cyclodisilazane reacts on at least a portion of the surface of the substrate to provide a chemisorbed layer; purging the reactor with a purge gas; introducing a plasma comprising nitrogen and an inert gas into the reactor to react with at least a portion of the chemisorbed layer and provide at least one reactive site wherein the plasma is generated at a power density ranging from about 0.01 to about 1.5 W/cm².

21 Claims, 2 Drawing Sheets

(52) U.S. Cl.
CPC ...... *H01L 21/0217* (2013.01); *H01L 21/0228* (2013.01); *H01L 21/02222* (2013.01); *H01L 21/02274* (2013.01)

(56) References Cited

U.S. PATENT DOCUMENTS

| | | | |
|---|---|---|---|
| 6,528,430 B2 | 3/2003 | Kwan et al. | |
| 9,637,823 B2 | 5/2017 | Knoops et al. | |
| 2005/0163927 A1* | 7/2005 | McSwiney | C07F 7/025 427/248.1 |
| 2009/0075490 A1 | 3/2009 | Dussarrat | |
| 2009/0155606 A1 | 6/2009 | Yoon et al. | |
| 2009/0263975 A1* | 10/2009 | Kadonaga | H01L 21/0217 438/763 |
| 2010/0081293 A1 | 4/2010 | Mallick et al. | |
| 2012/0196048 A1 | 8/2012 | Ueda | |
| 2013/0183835 A1 | 7/2013 | Nguyen et al. | |
| 2015/0099375 A1* | 4/2015 | Haripin | C23C 14/027 438/793 |
| 2015/0232992 A1* | 8/2015 | Kim | C23C 16/401 427/553 |
| 2016/0079054 A1* | 3/2016 | Chen | H01L 21/0228 438/762 |
| 2016/0326193 A1* | 11/2016 | Jang | H01L 21/0217 |

OTHER PUBLICATIONS

Bartholmei et al., "Zwei Wege zu Si-funktionellen Cyclosilazanen—Kristallstruktur des 1,3,6,8,10,12-Hexa-aza-2,4,5,7,9,11-hexa-sila-dispiro[4.1.4.1]dodecan" Z. anorg. dig. Chem. 556 129-140 (1988).

International Search Report and Written Opinion dated Oct. 18, 2016 by the European Patent Office for counterpart international application No. PCT/US2016/044472.

Klaus et al., "Atomic layer controlled growth of $Si_3N_4$ films using sequential surface reactions" Surface Science 418: L14-L19 (1998).

Knoops, et al, "Plasma-assisted ALD of Silicon Nitride from BTBAS: Influence of Plasma Exposure and Substrate Temperature" 13th International Conference on Atomic Layer Deposition, Jul. 28-31, 2013, San Diego, California, U.S.A. (22 pages).

* cited by examiner

COMPOSITIONS AND METHODS FOR DEPOSITING SILICON NITRIDE FILMS

This Application claims the benefit of Application No. 62/199,593, filed on Jul. 31, 2015. The disclosure of Application No. 62/199,593 is hereby incorporated by reference.

FIELD OF THE INVENTION

Described herein are a method and a composition for depositing conformal, stoichiometric or non-stoichiometric, silicon nitride film using a cyclodisilazane precursor. More specifically, described herein are deposition processes, such as without limitations, plasma enhanced atomic layer deposition ("PEALD"), plasma enhanced cyclic chemical vapor deposition ("PECCVD") using a cyclodisilazane precursor, and compositions comprising same, that are used to deposit a silicon nitride film.

BACKGROUND OF THE INVENTION

Low pressure chemical vapor deposition (LPCVD) processes are one of the more widely accepted methods used by semiconductor industry for the deposition of silicon nitride films. Low pressure chemical vapor deposition (LPCVD) using ammonia may require deposition temperatures of greater than 650° C. to obtain reasonable growth rates and uniformities. Higher deposition temperatures are typically employed to provide improved film properties. One of the more common industry methods to grow silicon nitride is through low pressure chemical vapor deposition in a hot wall reactor at temperatures greater than 750° C. using the silane, dichlorosilane, and/or ammonia as precursors. However, there are several drawbacks using this method. For example, certain precursors, such as silane are pyrophoric. This may present problems in handling and usage. Also, films deposited from dichlorosilane may contain certain impurities, such as chlorine and ammonium chloride, which are formed as byproducts during the deposition process.

Precursors that are used in depositing silicon nitride films such as bis(tertiary-butyl) silane (BTBAS) and chlorosilanes generally deposit the films at temperatures greater than 550° C. However, the trend of miniaturization of semiconductor devices and low thermal budget requires process temperature lower than 400° C. and higher deposition rate. The temperature, at which the silicon films are deposited, should decrease in order to prevent ion diffusion in the lattice, particularly for those substrates comprising metallization layers and on many Group III-V and II-VI devices.

US Publ. No. 2013/183835 ("the '835 Publication") describes methods and apparatus for forming conformal silicon nitride films at low temperatures on a substrate. The methods of forming a silicon nitride layer include performing a deposition cycle including flowing a processing gas mixture into a processing chamber having a substrate therein, wherein the processing gas mixture comprises precursor gas molecules having labile silicon to nitrogen, silicon to carbon, or nitrogen to carbon bonds, activating the precursor gas at a temperature between about 20° C. to about 480° C. by preferentially breaking labile bonds to provide one or more reaction sites along a precursor gas molecule, forming a precursor material layer on the substrate, wherein the activated precursor gas molecules bond with a surface on the substrate at the one or more reaction sites, and performing a plasma treatment process on the precursor material layer to form a conformal silicon nitride layer.

US Publ. No. 2009/075490 ("the '490 Publication") describes a method of preparing a silicon nitride film comprising introducing a silicon wafer to a reaction chamber; introducing a silicon nitride compound to the reaction chamber; purging the reaction chamber with an inert gas; and introducing a nitrogen-containing co-reactant in gaseous form to the reaction chamber under conditions suitable for the formation of a monomolecular layer of a silicon nitride film on the silicon wafer.

US Publ. No. 2009/155606 ("the '606 Publication") describes a cyclical method of depositing a silicon nitride film on a substrate. In one embodiment a method includes supplying a chlorosilane to a reactor in which a substrate is processed; supplying a purge gas to the reactor; and providing ammonia plasma to the reactor.

U.S. Pat. No. 6,391,803 ("the '803 patent") describes an atomic layer deposition method of forming a solid thin film layer containing Si.

U.S. Pat. No. 6,528,430 ("the '430 patent") describes an ALD method for forming silicon nitride thin films employing Si2Cl6 and NH3, or Si2Cl6 and activated NH3 as reactants.

U. S. Publ. No. 2010/0081293 ("the '293 Publication") describes a method for depositing a silicon nitride which includes introducing a silicon precursor and a radical nitrogen precursor to a deposition chamber. The silicon precursor has an N—Si—H bond, N—Si—Si bond and/or Si—Si—H bond. The radical nitrogen precursor is substantially free from included oxygen. The radical nitrogen precursor is generated outside the deposition chamber. The silicon precursor and the radical nitrogen precursor interact to form the silicon nitride based dielectric layer. The '293 Publication further teaches that the use of radical inert gas precursors that can be generated outside the deposition chamber from a starting material selected from Ne, Ar, Kr, and/or Xe.

U. S. Publ. No. 2012/196048 ("the '048 Publication") describes a method for forming a thin film by alternating multiple times, respectively, a process of adsorbing a precursor onto a substrate and a process of treating the adsorbed surface using a reactant gas and a plasma, wherein the reactant gas is supplied substantially uniformly over the substrate, and the plasma is pulse-time-modulated and applied in the process of supplying the reactant gas.

WO Publ. No 2015105350 provides a novel cyclodisilazane derivatives for forming a high purity silicon-containing thin film having excellent physical and electrical properties by various deposition methods.

The reference entitled "Atomic layer controlled growth of Si3N4 films using sequential surface reactions." Klaus, et al., Surface Science 418: L14-L19 (1998) describes a method for depositing Si3N4 thin films with atomic layer control on Si(100) substrates using sequential surface chemical reactions. The Si3N4 film growth was accomplished by separating the binary reaction 3SiCl4+4NH3→Si3N4+12HCl into two half-reactions. Successive application of the SiCl4 and NH3 half-reactions in an ABAB . . . sequence produced Si3N4 deposition at substrate temperatures between 500 and 900° K and SiCl4 and NH3 reactant pressures of 1-10 Torr.

The reference entitled "Plasma-assisted ALD of Silicon Nitride from BTBAS: Influence of Plasma Exposure and Substrate Temperature" 12th International Conference on Atomic Layer Deposition. San Diego, Calif. Knoops, et al (ALD2013) teaches deposition of Si nitride using BTBAS (bis-aminosilane) with N2 plasma. The deposited film has about 5% 02 and about 5% carbon.

The disclosure of the previously described patents, patent applications and publications is hereby incorporated by reference.

Accordingly, there is a need in the art to provide a low temperature (e.g., processing temperature of 400° C. or below) method for depositing a conformal, high quality, silicon nitride film wherein the film has one or more of the following characteristics: a density of 2.2 grams per cubic centimeter (g/cc) or greater, a low wet etch rate (as measured in dilute hydrofluoric acid (HF)), and combinations thereof compared to other silicon nitride films using other deposition methods or precursors.

BRIEF SUMMARY OF THE INVENTION

Described herein are methods for forming stoichiometric or non-stoichiometric silicon nitride films, which may further comprise carbon, oxygen, or both, onto at least a portion of a substrate. In one aspect, the organoaminosilane precursor described herein comprises at least one cyclodisilazane having a hydrocarbon leaving group and at least two Si—H groups represented by Formula I below:

wherein R is selected from a branched $C_4$ to $C_{10}$ alkyl group; $R^1$, $R^2$, $R^3$, $R^4$ are each independently selected from a hydrogen atom, a linear or branched $C_1$ to $C_{10}$ alkyl group, a linear or branched $C_2$ to $C_6$ alkenyl group, a linear or branched $C_2$ to $C_6$ alkynyl group, a $C_1$ to $C_6$ dialkylamino group, a $C_6$ to $C_{10}$ aryl group, an electron withdrawing group, a $C_4$ to $C_{10}$ aryl group, and a halide atom. In certain embodiments of Formula I, $R^{1-4}$ are all hydrogen. In other embodiments, $R^1$ and $R^3$ are hydrogen.

In another aspect, there is provided a composition comprising: (a) at least one cyclodisilazane comprising a hydrocarbon leaving group and at least two Si—H groups represented by Formula I below:

wherein R is selected from a branched $C_4$ to $C_{10}$ alkyl group; $R^1$, $R^2$, $R^3$, $R^4$ are each selected independently selected from a hydrogen atom, a linear or branched $C_1$ to $C_{10}$ alkyl group, a linear or branched $C_2$ to $C_6$ alkenyl group, a linear or branched $C_2$ to $C_6$ alkynyl group, a $C_1$ to $C_6$ dialkylamino group, a $C_6$ to $C_{10}$ aryl group, an electron withdrawing group, a $C_4$ to $C_{10}$ aryl group, and a halide atom; and (b) a solvent. In certain embodiments of Formula I, $R^{1-4}$ are all hydrogen. In other embodiments, $R^1$ and $R^3$ are hydrogen. In certain embodiments of the composition described herein, the solvent is at least one selected from the group consisting of ether, tertiary amine, alkyl hydrocarbon, aromatic hydrocarbon, tertiary aminoether, and combinations thereof. In certain embodiments, the difference between the boiling point of the cyclodisilazane and the boiling point of the solvent is 40° C. or less.

In one aspect, there is provided a method of forming a silicon nitride film, the method comprising the steps of:
 a. providing a substrate in a reactor;
 b. introducing into the reactor a cyclodisilazane precursor comprising a leaving group and at least two Si—H groups represented by Formula I below:

wherein R is each independently selected from a branched $C_4$ to $C_{10}$ alkyl group; $R^1$, $R^2$, $R^3$, $R^4$ are each independently selected from a hydrogen atom, a linear or branched $C_1$ to $C_{10}$ alkyl group, a linear or branched $C_2$ to $C_6$ alkenyl group, a linear or branched $C_2$ to $C_6$ alkynyl group, a $C_1$ to $C_6$ dialkylamino group, a $C_6$ to $C_{10}$ aryl group, an electron withdrawing group, a $C_4$ to $C_{10}$ aryl group, and a halide atom;
 c. purging the reactor with a purge gas;
 d. introducing a plasma containing source into the reactor to react with at least a portion of the chemisorbed layer and provide at least one reactive site wherein the plasma is generated at a power density ranging from about 0.01 to about 1.5 W/cm² and;
 e. optionally purge the reactor with an inert gas; and wherein the steps b through e are repeated until a desired thickness of the silicon nitride film is obtained.

In another aspect, there is provided a method of forming a silicon nitride film using a deposition process selected from a plasma enhanced atomic layer deposition process or plasma enhanced ALD-like process, the method comprising the steps of:
 a. providing a substrate in a reactor;
 b. introducing into the reactor at least one cyclodisilazane precursor selected from the group consisting of 1,3-bis(tert-butyl)cyclodisilazane, 1,3-bis(tert-butyl)-2-methylcyclodisilazane, 1,3-bis(tert-butyl)-2,4-dimethylcyclodisilazane, 1,3-bis(tert-amyl)cyclodisilazane, 1,3-bis(tert-amyl)-2-methylcyclodisilazane, 1,3-bis(tert-amyl)-2,4-dimethylcyclodisilazane, 1,3-bis(tert-butyl)-2-chloroclodisilazane, 1,3-bis(tert-butyl)-2,4-dichlorocyclodisilazane, 1,3-bis(tert-amyl)-2-chloroclodisilazane, 1,3-bis(tert-amyl)-2,4-dichlorocyclodisilazane, 1,3-bis(tert-butyl)-2,4,4-trilchlorocyclodisilazane, 1,3-bis(tert-butyl)-2-dimethylcyclodisilazane, 1,3-bis(tert-butyl)-2-chloro-2-methylcyclodisilazane, 1,3-bis(tert-amyl)-2-dimethylcyclodisilazane, 1,3-bis(tert-amyl)-2-chloro-2-methyl-cyclodisilazane, 1,3-bis(tert-butyl)-2-vinylcyclodisilazane, 1,3-bis(tert-butyl)-2-ethynyl cyclodisilazane and combinations thereof wherein the at least one cyclodisilazane reacts on at least a portion of the surface of the substrate to provide a chemisorbed layer;
 c. purging the reactor with a purge gas comprising at least one selected from nitrogen, a noble gas, and combinations thereof;

d. introducing a plasma containing source into the reactor to react with at least a portion of the chemisorbed layer and provide an at least one reactive site wherein the plasma is generated at a power density ranging from about 0.01 to about 1.5 W/cm$^2$; and e. optionally purge the reactor with an inert gas; and wherein the steps b through e are repeated until a desired thickness of the silicon nitride film is obtained.

In a further aspect, the invention relates to a method of forming a silicon nitride film onto at least a surface of a substrate, the method comprising the steps of:

a. providing a substrate in a reactor;

b. introducing into the reactor at least one cyclodisilazane precursor selected from the group consisting of 1,3-bis(tert-butyl)cyclodisilazane, 1,3-bis(tert-butyl)-2-methylcyclodisilazane, 1,3-bis(tert-butyl)-2,4-dimethylcyclodisilazane, 1,3-bis(tert-amyl)cyclodisilazane, 1,3-bis(tert-amyl)-2-methylcyclodisilazane, 1,3-bis(tert-amyl)-2,4-dimethylcyclodisilazane, 1,3-bis(tert-butyl)-2-chloroclodisilazane, 1,3-bis(tert-butyl)-2,4-dichlorocyclodisilazane, 1,3-bis(tert-amyl)-2-chloroclodisilazane, 1,3-bis(tert-amyl)-2,4-dichlorocyclodisilazane, 1,3-bis(tert-butyl)-2,4,4-trilchlorocyclodisilazane, 1,3-bis(tert-butyl)-2-dimethylcyclodisilazane, 1,3-bis(tert-butyl)-2-chloro-2-methylcyclodisilazane, 1,3-bis(tert-amyl)-2-dimethylcyclodisilazane, 1,3-bis(tert-amyl)-2-chloro-2-methyl-cyclodisilazane, 1,3-bis(tert-butyl)-2-vinylcyclodisilazane, 1,3-bis(tert-butyl)-2-ethynylcyclodisilazane and combinations thereof wherein the at least one cyclodisilazane reacts on at least a portion of the surface of the substrate to provide a chemisorbed layer;

c. purging the reactor with a purge gas comprising at least one selected from nitrogen, a noble gas, and combinations thereof;

d. introducing a plasma containing source into the reactor to react with at least a portion of the chemisorbed layer and provide an at least one reactive site wherein the plasma is generated at a power density ranging from about 0.01 to about 1.5 W/cm$^2$; and e. optionally purge the reactor with an inert gas; and wherein the steps b through e are repeated until a desired thickness of the silicon nitride film is obtained.

Another aspect of the invention relates to a method of forming a silicon nitride film onto at least a surface of a substrate, the method comprising the steps of:

a. providing a substrate in a reactor;

b. introducing into the reactor at least one cyclodisilazane precursor selected from the group consisting of 1,3-bis(tert-butyl)cyclodisilazane, 1,3-bis(tert-butyl)-2-methylcyclodisilazane, 1,3-bis(tert-butyl)-2,4-dimethylcyclodisilazane, 1,3-bis(tert-amyl)cyclodisilazane, 1,3-bis(tert-amyl)-2-methylcyclodisilazane, 1,3-bis(tert-amyl)-2,4-dimethylcyclodisilazane, 1,3-bis(tert-butyl)-2-chloroclodisilazane, 1,3-bis(tert-butyl)-2,4-dichlorocyclodisilazane, 1,3-bis(tert-amyl)-2-chloroclodisilazane, 1,3-bis(tert-amyl)-2,4-dichlorocyclodisilazane, 1,3-bis(tert-butyl)-2,4,4-trilchlorocyclodisilazane, 1,3-bis(tert-butyl)-2-dimethylcyclodisilazane, 1,3-bis(tert-butyl)-2-chloro-2-methylcyclodisilazane, 1,3-bis(tert-amyl)-2-dimethylcyclodisilazane, 1,3-bis(tert-amyl)-2-chloro-2-methyl-cyclodisilazane, 1,3-bis(tert-butyl)-2-vinylcyclodisilazane, 1,3-bis(tert-butyl)-2-ethynyl cyclodisilazane and combinations thereof wherein the at least one cyclodisilazane reacts on at least a portion of the surface of the substrate to provide a chemisorbed layer;

c. purging the reactor with a purge gas comprising at least one selected from nitrogen, a noble gas, and combinations thereof;

d. introducing a plasma containing source into the reactor to react with at least a portion of the chemisorbed layer and provide an at least one reactive site wherein the plasma is generated at a power density ranging from about 0.01 to about 1.5 W/cm$^2$; and e. optionally purge the reactor with an inert gas; and wherein the steps b through e are repeated until a desired thickness of the silicon nitride film is obtained.

A further aspect of the invention relates to a composition for a vapor deposition of a silicon-containing film comprising at least one cyclodisilazane precursor selected from the group consisting of 1,3-bis(tert-butyl)cyclodisilazane, 1,3-bis(tert-butyl)-2-methylcyclodisilazane, 1,3-bis(tert-butyl)-2,4-dimethylcyclodisilazane, 1,3-bis(tert-amyl)cyclodisilazane, 1,3-bis(tert-amyl)-2-methylcyclodisilazane, 1,3-bis(tert-amyl)-2,4-dimethylcyclodisilazane, 1,3-bis(tert-butyl)-2-chloroclodisilazane, 1,3-bis(tert-butyl)-2,4-dichlorocyclodisilazane, 1,3-bis(tert-amyl)-2-chloroclodisilazane, 1,3-bis(tert-amyl)-2,4-dichlorocyclodisilazane, 1,3-bis(tert-butyl)-2,4,4-trilchlorocyclodisilazane, 1,3-bis(tert-butyl)-2-dimethylcyclodisilazane, 1,3-bis(tert-butyl)-2-chloro-2-methylcyclodisilazane, 1,3-bis(tert-amyl)-2-dimethylcyclodisilazane, 1,3-bis(tert-amyl)-2-chloro-2-methyl-cyclodisilazane, 1,3-bis(tert-butyl)-2-vinylcyclodisilazane, 1,3-bis(tert-butyl)-2-ethynyl cyclodisilazane.

Another aspect of the invention relates to a vessel which is used to deliver a cyclodisilazane precursor for the deposition of a silicon-containing film, the vessel comprising:

a cyclodisilazane precursor selected from the group consisting of 1,3-bis(tert-butyl)cyclodisilazane, 1,3-bis(tert-butyl)-2-methylcyclodisilazane, 1,3-bis(tert-butyl)-2,4-dimethylcyclodisilazane, 1,3-bis(tert-amyl)cyclodisilazane, 1,3-bis(tert-amyl)-2-methylcyclodisilazane, 1,3-bis(tert-amyl)-2,4-dimethylcyclodisilazane, 1,3-bis(tert-butyl)-2-chloroclodisilazane, 1,3-bis(tert-butyl)-2,4-dichlorocyclodisilazane, 1,3-bis(tert-amyl)-2-chloroclodisilazane, 1,3-bis(tert-amyl)-2,4-dichlorocyclodisilazane, 1,3-bis(tert-butyl)-2,4,4-trilchlorocyclodisilazane, 1,3-bis(tert-butyl)-2-dimethylcyclodisilazane, 1,3-bis(tert-butyl)-2-chloro-2-methylcyclodisilazane, 1,3-bis(tert-amyl)-2-dimethylcyclodisilazane, 1,3-bis(tert-amyl)-2-chloro-2-methyl-cyclodisilazane, 1,3-bis(tert-butyl)-2-vinylcyclodisilazane, 1,3-bis(tert-butyl)-2-ethynyl cyclodisilazane1,3-bis(tert-butyl)-2-vinylcyclodisilazane, 1,3-bis(tert-butyl)-2-ethynyl cyclodisilazane; and wherein the purity of the precursor is about 98% or greater; and the headspace of the container comprising inert gas selected from the group consisting of helium, argon, nitrogen and combination thereof.

A further aspect of the invention relates to a silicon containing film produced by any of the foregoing methods or from any of the foregoing compositions wherein the silicon nitride film has a density of 2.2 g/cc or greater.

The aspects of the invention can be used alone or in various combinations with each other.

DETAILED DESCRIPTION OF THE INVENTION

The deposition of conformal, stoichiometric and non-stoichiometric silicon nitride films at low temperature, e.g., temperatures of 400° C. or less, which meet one or more criteria to be considered a high quality film, has been a long-standing industry challenge. There are several applications in semiconductor field such as advanced patterning or spacer which require high quality films. A silicon nitride film is considered a "high quality" film if it has one or more of the following characteristics: a density of 2.2 grams per cubic centimeter (g/cc) or greater (e.g., about 2.2 to about 3.0 g/cc, about 2.4 to about 3.0/cc and in some cases about 2.5 to about 2.8 g/cc), a low wet etch rate (as measured in dilute hydrofluoric acid (0.5 wt % HF in DI water) in accordance with the method described below in greater detail), and combinations thereof compared to other silicon nitride films. In these or other embodiments, the refractive index for the silicon nitride film should be 1.9 or higher (e.g., about 1.9 to about 2.4, about 2.0 to about 2.4 and in some cases about 2.0 to about 2.2) as measured by ellipsometer.

In one aspect, described herein is a composition for depositing a silicon-containing film comprises: (a) at least one cyclodisilazane precursor having Formula I selected from the group consisting of 1,3-bis(tert-butyl)cyclodisilazane, 1,3-bis(tert-butyl)-2-methylcyclodisilazane, 1,3-bis(tert-butyl)-2,4-dimethylcyclodisilazane, 1,3-bis(tert-amyl)cyclodisilazane, 1,3-bis(tert-amyl)-2-methylcyclodisilazane, 1,3-bis(tert-amyl)-2,4-dimethylcyclodisilazane, 1,3-bis(tert-butyl)-2-chlorocyclodisilazane, 1,3-bis(tert-butyl)-2,4-dichlorocyclodisilazane, 1,3-bis(tert-amyl)-2-chlorocyclodisilazane, 1,3-bis(tert-amyl)-2,4-dichlorocyclodisilazane, 1,3-bis(tert-butyl)-2,4,4-trilchlorocyclodisilazane, 1,3-bis(tert-butyl)-2-dimethylcyclodisilazane, 1,3-bis(tert-butyl)-2-chloro-2-methylcyclodisilazane, 1,3-bis(tert-amyl)-2-dimethylcyclodisilazane, 1,3-bis(tert-amyl)-2-chloro-2-methyl-cyclodisilazane, 1,3-bis(tert-butyl)-2-vinylcyclodisilazane, 1,3-bis(tert-butyl)-2-ethynyl cyclodisilazane and combinations thereof; and; (b) at least one solvent. In certain embodiments of the composition described herein, exemplary solvents can include, without limitation, ether, tertiary amine, alkyl hydrocarbon, aromatic hydrocarbon, tertiary aminoether, and combinations thereof. In certain embodiments, the difference between the boiling point of the organoaminodisilane and the boiling point of the solvent is 40° C. or less. The wt % of silicon precursor compound in the solvent can vary from 1 to 99 wt %, or 10 to 90 wt %, or 20 to 80 wt %, or 30 to 70 wt %, or 40 to 60 wt %, to 50 to 50 wt %. In some embodiments, the composition can be delivered via direct liquid injection into a reactor chamber for silicon-containing film.

In one embodiment, described herein is an atomic layer deposition (ALD) or ALD-like method at a low temperature, or one or more deposition temperatures ranging from about 25° C. to about 400° C., using a cyclodisilazane precursor having Formula I described herein in a plasma process which comprises nitrogen and optionally a noble gas.

Described herein are methods for forming a stoichiometric or non-stoichiometric silicon nitride film comprising silicon and nitrogen onto at least a portion of a substrate. In certain embodiments, the silicon nitride film further comprises carbon or aluminum such as a silicon carbonitride or silicon aluminum nitride film. In certain embodiments, the silicon nitride film further comprises oxygen such as a silicon oxynitride film. In this or other embodiments, the silicon nitride film comprises oxygen and carbon such as a silicon carboxynitride film with oxygen content ranging from 0.1 to 30 at. % and carbon content ranging from 0.1 to 40 at. % measured by XPS.

The silicon nitride films described herein are deposited using at least one cyclodisilazane that comprises a leaving group and at least two Si—H groups and represented by Formula I below:

$$\begin{array}{c} R \\ | \\ R^1 \diagdown N \diagdown R^3 \\ \phantom{R^1}Si \phantom{N} Si \\ R^2 \diagup N \diagup R^4 \\ | \\ R \end{array}$$ I wherein R is selected from a branched $C_4$ to $C_{10}$ alkyl group; $R^1$, $R^2$, $R^3$, $R^4$ are each independently selected from a hydrogen atom, a linear or branched $C_1$ to $C_{10}$ alkyl group, a linear or branched $C_2$ to $C_6$ alkenyl group, a linear or branched $C_2$ to $C_6$ alkynyl group, a $C_1$ to $C_6$ dialkylamino group, a $C_6$ to $C_{10}$ aryl group, an electron withdrawing group, a $C_4$ to $C_{10}$ aryl group, and a halide atom. In certain embodiments of Formula I, substituents $R^{1-4}$ are all hydrogen. In other embodiments, $R^1$ and $R^3$ are hydrogen. In still other embodiments of Formula I, at least one or all of substituents $R^{1-4}$ are selected from a halide atom (e.g., F, Cl, Br, I), a hydrogen atom, a methyl group, or combinations thereof.

Exemplary cyclodisilazane precursors having Formula I, include, but are not limited to, are the following precursors shown in Table 1.

TABLE 1

Precursors having Formula I

1,3-bis(tert-butyl)-2-methylcyclodisilazane

TABLE 1-continued

Precursors having Formula I

1,3-bis(tert-butyl)-2,4-
dimethylcyclodisilazane

1,3-bis(tert-butyl)-2-chlorocyclodisilazane 1,3-bis(tert-butyl)-2,4-
dichlorocyclodsilazane

1,3-bis(tert-amyl)cyclodisilazane

1,3-bis(tert-amyl)-2-methyl-
cyclodisilazane

TABLE 1-continued

Precursors having Formula I

1,3-bis(tert-amyl)-2,4-dimethyl-
cyclodisilazane 1,3-bis(tert-amyl)-2-chloro-cyclodisilazane

1,3-bis(tert-amyl)-2,4-dichloro-
cyclodisilazane

1,3-bis(tert-butyl)-2,2,4-trichloro-
cyclodisilazane

TABLE 1-continued

Precursors having Formula I

1,3-bis(tert-butyl)-2-dimethylcyclodisilazane

1,3-bis(tert-butyl)-2-chloro-2-methylcyclodisilazane

1,3-bis(tert-amyl)-2-dimethylcyclodisilazane 1,3-bis(tert-amyl)-2-chloro-2-methylcyclodisilazane 1,3-bis(tert-butyl)-2-vinylcyclodisilazane 1,3-bis(tert-butyl)-2-ethynyl cyclodisilazane The cyclodisilazane precursors having Formula I described herein exhibit a balance of reactivity and stability that makes them ideally suited as PEALD or PECCVD precursors for semiconductor device manufacturing processes. With regard to reactivity, certain precursors may have boiling points (e.g., greater than about 200° C.) that are too high to be vaporized and delivered to the reactor to be deposited as a film on a substrate. Precursors having higher relative boiling points require that the delivery container and lines need to be heated at or above the boiling point of the precursor under a given vacuum to prevent condensation or particles from forming in the container, lines, or both. Importantly, the cyclodisilazane precursors having Formula I possess a better leaving group than those disclosed in prior art, (i.e. tert-butyl vs iso-propyl), and, therefore, it is believed enabling deposition of silicon nitride having less carbon content (e.g., less than about 5 at %, preferably less than 1 at. %, most preferably less than 0.1 at %). With regard to stability, other precursors may form silane ($SiH_4$) or disilane ($Si_2H_6$) as they degrade. Silane is pyrophoric at room temperature or it can spontaneously combust which presents safety and handling issues. Moreover, the formation of silane or disilane and other by-products decreases the purity level of the precursor and changes as small as 1-2% in chemical purity may be considered unacceptable for reliable semiconductor manufacture. In certain embodiments, the cyclodisilazane precursors having Formula I described herein comprise 2% or less by weight, or 1% or less by weight, or 0.5% or less by weight of by-product (after being stored for a time period of 6 months or greater, or one year or greater) which is indicative of being shelf stable. In certain embodiments, the cyclodisilazane precursors having Formula I described herein comprise 100 ppm or less of halide impurity such as chloride, or 50 ppm or less of halide impurity, or 10 ppm or less of halide impurity. In addition to the foregoing advantages, in certain embodiments, such as for depositing a silicon nitride film using PEALD, or PECCVD deposition method, the cyclodisilazane precursor described herein may be able to deposit high density materials at one or more deposition temperatures, e.g., 400° C. or less, 350° C. or less, 300° C. or less, or 250° C. or less, 200° C. or less, 150° C. or less, 100° C. or less, or 50° C. or less.

Throughout the description, the term "alkyl hydrocarbon" refers a linear or branched $C_6$ to $C_{20}$ hydrocarbon, cyclic $C_6$ to $C_{20}$ hydrocarbon. Exemplary hydrocarbon includes, but not limited to, hexane, heptane, octane, nonane, decane, dodecane, cyclooctane, cyclononane, cyclodecane.

Throughout the description, the term "aromatic hydrocarbon" refers a $C_6$ to $C_{20}$ aromatic hydrocarbon. Exemplary aromatic hydrocarbon n includes, but not limited to, toluene, mesitylene.

In Formula I and throughout the description, the term "cyclic alkyl" denotes a cyclic functional group having from 3 to 10 or from 4 to 10 carbon atoms or from 5 to 10 carbon atoms. Exemplary cyclic alkyl groups include, but are not limited to, cyclobutyl, cyclopentyl, cyclohexyl, and cyclooctyl groups.

In Formula I and throughout the description, the term "aryl" denotes an aromatic cyclic functional group having from 5 to 12 carbon atoms or from 6 to 10 carbon atoms. Exemplary aryl groups include, but are not limited to, phenyl, benzyl, chlorobenzyl, tolyl, and o-xylyl.

In Formulas I and throughout the description, the term "alkyl" denotes a linear, or branched functional group having from 1 to 10 or 1 to 4 carbon atoms. Exemplary alkyl groups include, but are not limited to, methyl, ethyl, n-propyl, isopropyl, n-butyl, isobutyl, sec-butyl, tert-butyl, n-pentyl, iso-pentyl, tert-pentyl, hexyl, isohexyl, and neohexyl. In certain embodiments, the alkyl group may have one or more functional groups such as, but not limited to, an alkoxy group, a dialkylamino group or combinations thereof, attached thereto. In other embodiments, the alkyl group does not have one or more functional groups attached thereto.

In Formula I and throughout the description, the term "alkenyl group" denotes a group which has one or more carbon-carbon double bonds and has from 2 to 10 or from 2 to 6 or from 2 to 4 carbon atoms. Exemplary alkenyl groups include, but are not limited to, vinyl ($CH_2=CH-$) or allyl.

In Formula I and throughout the description, the term "alkynyl group" denotes a group which has one or more carbon-carbon triple bonds and has from 2 to 10 or from 2 to 6 or from 2 to 4 carbon atoms. Exemplary alkynyl groups include, but are not limited to ethynyl (acetylenyl).

In Formula I and throughout the description, the term "dialkylamino group" denotes a group which has two alkyl groups attached to a nitrogen atom and has from 1 to 10 or from 2 to 6 or from 2 to 4 carbon atoms. Exemplary aryl groups include, but are not limited to dimethylamino, diethylamino, and ethylmethylamino.

The term "good hydrocarbon leaving group" or "hydrocarbon leaving group" as used herein describes a hydrocarbon group bonded to a nitrogen atom that can be easily broken to form a stable hydrocarbon radical during deposition process, thus resulting in a silicon nitride film having less carbon content (e.g., a carbon content less than about 1 at % or less). The stability of hydrocarbon radicals is vinyl radical>benzyl radical>tert-butyl radical>iso-propyl radical>methyl radical. Examples of good hydrocarbon leaving groups or substituents include, but are not limited to, tert-butyl or tert-amyl groups both of which are better leaving group than iso-propyl. In certain embodiments of Formula I, R is selected from a tert-butyl or tert-amyl group.

Throughout the description, the term "organoamine" as used herein describes organic compound has at least one nitrogen atom. Examples of organoamine, but are not limited to, methylamine, ethylamine, propylamine, iso-propylamine, tert-butylamine, sec-butylamine, tert-amylamine, ethylenediamine, dimethylamine, trimethylamine, diethylamine, triethylamine.

The term "electron withdrawing group" as used herein describes an atom or group thereof that acts to draw electrons away from the Si—N bond. Examples of suitable electron withdrawing groups or substituents include, but are not limited to, nitriles (CN). In certain embodiments, electron withdrawing substituent can be adjacent to or proximal to N in any one of Formula I. Further non-limiting examples of an electron withdrawing group includes F, Cl, Br, I, CN, $NO_2$, RSO, and/or $RSO_2$ wherein R can be a $C_1$ to $C_{10}$ alkyl group such as, but not limited to, a methyl group or another group.

Throughout the description, the term "silicon nitride" as used herein refers to a film comprising silicon and nitrogen selected from the group consisting of stoichmeitric or non-stoichemetric silicon nitride, silicon carbonitride, silicon carboxynitride, silicon aluminum nitride and there mixture thereof. For silicon aluminum nitride, aluminum content can range from 0.1 to 20 at %.

In certain embodiments, one or more of the alkyl group, alkenyl group, alkynyl group, alkoxy group, dialkylamino group, aryl group, and/or electron withdrawing group in Formula I may be substituted or have one or more atoms or group of atoms substituted in place of, for example, a hydrogen atom. Exemplary substituents include, but are not limited to, oxygen, sulfur, halogen atoms (e.g., F, Cl, I, or Br), nitrogen, and phosphorous. An exemplary substituted substituent includes, but is not limited to, a linear or branched $C_1$ to $C_6$ fluorinated alkyl group. In one particular embodiment, at least one of $R^1$ through $R^4$ is a linear or branched $C_1$ to $C_6$ fluorinated alkyl group. In other embodiments, one or more of the alkyl group, alkenyl group, alkynyl group, alkoxy group, dialkylamino aryl group, and/or electron withdrawing group in Formula I is unsubstituted.

The method used to form the silicon nitride films or coatings are deposition processes. Examples of suitable deposition processes for the method disclosed herein include, but are not limited to, plasma enhanced ALD (PEALD) or plasma enhanced cyclic CVD (PECCVD) process. As used herein, the term "chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits films of materials onto substrates of varying compositions. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the silicon nitride film is deposited using an ALD process. In another embodiment, the silicon nitride film is deposited using a CCVD process. In a further embodiment, the silicon nitride film is deposited using a thermal CVD process. The term "reactor" as used herein, includes without limitation, reaction chamber or deposition chamber. The ALD-like process is defined herein as a cyclic CVD process that provides a high conformal silicon nitride film such as, silicon nitride or silicon carbonitride on a substrate as shown by having at least one of the following: percentage of non-uniformity of about 10% or less (e.g., about 1 to about 10%, about 1 to about 5% and in some cases about 1 to about 3%), as measured by ellipsometer, a deposition rate of 1 Å or greater per cycle (e.g., about 1 to about 4 Å per cycle, about 1 to about 3 Å per cycle and in some cases about 1 to about 2 Å per cycle), or a combination thereof.

In certain embodiments, the method disclosed herein avoids pre-reaction of the precursors by using PEALD or PECCVD methods that separate the precursors prior to and/or during the introduction to the reactor. In this connection, deposition techniques such as PEALD or PECCVD processes are used to deposit the silicon nitride film. In one embodiment, the film is deposited via a PEALD process by exposing the substrate surface alternatively to the one or more the silicon nitride precursor, nitrogen-containing source, or other precursor or reagent. Film growth proceeds by self-limiting control of surface reaction, the pulse length of each precursor or reagent, and the deposition temperature. However, once the surface of the substrate is saturated, the film growth ceases.

In certain embodiments, the method described herein further comprises one or more additional silicon precursors other than the cyclodisilazane precursor having Formula I. Examples of additional silicon nitride precursors include, but are not limited to, monochlorosilane, dichlorosilane, hexachlorodisilane, di-iso-propylaminosilane, di-sec-butylaminosilane, bis(tertbutylamino)silane, bis(diethylamino) silane, tris(dimethylamino)silane.

Depending upon the deposition method, in certain embodiments, the at least one cyclodisilazane precursors may be introduced into the reactor at a predetermined molar volume, or from about 0.1 to about 1000 micromoles. In this or other embodiments, the at least one cyclodisilazane precursor may be introduced into the reactor for a predetermined time period. In certain embodiments, the time period ranges from about 0.001 to about 500 seconds.

In certain embodiments, the silicon nitride films comprise silicon and nitrogen. In these embodiments, the silicon nitride films deposited using the methods described herein are formed in the presence of nitrogen-containing source. A nitrogen-containing source may be introduced into the reactor in the form of at least one nitrogen-containing source and/or may be present incidentally in the other precursors used in the deposition process. Suitable nitrogen-containing source gases may include, for example, nitrogen/argon plasma. In certain embodiments, the nitrogen-containing source comprises nitrogen/argon plasma source gas that is introduced into the reactor at a flow rate ranging from about 1 to about 2000 standard cubic centimeters (sccm) or from about 1 to about 1000 sccm. The nitrogen-containing source can be introduced for a time that ranges from about 0.1 to about 100 seconds. In embodiments wherein the film is deposited by an ALD or a cyclic CVD process, the precursor pulse can have a pulse duration that is greater than 0.01 seconds, and the nitrogen-containing source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between.

In the method described herein, a nitrogen-containing plasma comprising a nitrogen containing gas such as, without limitation, nitrogen and optionally a noble gas can be generated in situ or remotely, preferably a noble gas with an atomic mass greater than nitrogen's atomic mass (i.e., 28 amu). The presence of a noble gas with atomic mass greater than nitrogen's atomic mass is believed to create more atomic nitrogen radicals. The nitrogen plasma source gas is introduced into the reactor at a flow rate ranging from about 1 to about 2000 square cubic centimeters (sccm) or from about 1 to about 1000 sccm or more. The nitrogen containing plasma can be introduced for a time that ranges from about 0.01 to about 100 seconds or more. In embodiments, the precursor pulse can have a pulse duration that is greater than 0.01 seconds, and the nitrogen-containing plasma can have a pulse duration that is less than 0.01 seconds, while the water pulse duration can have a pulse duration that is less than 0.01 seconds. In yet another embodiment, the purge duration between the precursor pulse and nitrogen plasmas that can be as low as 0 seconds. In yet another embodiment, a hydrogen plasma can be generated in situ or remotely using pure hydrogen ($H_2$)) mixed with a noble gas when a hydrogen plasma can be employed. The weight percentage of the noble gas in the plasma containing both nitrogen and noble gas can vary from 1 wt % to 99% whereas the weight percentage of the noble gas in the plasma containing both hydrogen and noble gas can also vary from 1 wt % to 99%.

The deposition methods described herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon (Ne), hydrogen ($H_2$), and mixtures thereof. In certain embodiments, the inert gas that is used as a purge gas comprises a noble gas. The term "noble gas" as used herein means those gases found in Group 18 of the Periodic Table and include, helium (He), neon (Ne), argon (Ar), Xenon (Xe), krypton (Kr), and mixtures thereof. In one particular embodiment, the noble gas used as a purge gas comprises argon. In this or other embodiments, the purge gas comprising Ar is supplied into the reactor at a flow rate ranging from about 10 to about 2000 sccm for about 0.1 to 1000 seconds, thereby purging the unreacted precursor material and any byproduct that may remain in the reactor.

The respective step of supplying the precursors, the nitrogen-containing source, and/or other precursors, source gases, and/or reagents may be performed by changing the time for supplying them to change the stoichiometric composition of the resulting silicon nitride film.

Energy is applied to the at least one of the precursor, nitrogen-containing source, reducing agent, other precursors or combination thereof to induce reaction and to form the silicon nitride film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

The cyclodisilazane precursors may be delivered to the reaction chamber such as a PEALD or PECCVD reactor either single wafer or batch in a variety of ways such as bubbling, vapor draw, or direct liquid injection (DLI). In one embodiment, a liquid delivery system may be utilized. In an alternative embodiment, a combined liquid delivery and flash vaporization process unit may be employed, such as, for example, the turbo vaporizer manufactured by MSP

Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate. Exemplary solvents can include, without limitation, ether, tertiary amine, alkyl hydrocarbon, aromatic hydrocarbon, tertiary aminoether, and combinations thereof. In certain embodiments, the difference between the boiling point of the organoaminodisilane and the boiling point of the solvent is 40° C. or less. The wt % of silicon precursor compound in the solvent can vary from 1 to 99 wt %, or 10 to 90 wt %, or 20 to 80 wt %, or 30 to 70 wt %, or 40 to 60 wt %, ot 50 to 50 wt %. In some embodiments, the composition can be delivered via direct liquid injection into a reactor chamber for silicon-containing film.

In certain embodiments, the gas lines connecting from the precursor canisters to the reaction chamber are heated to one or more temperatures depending upon the process requirements and the container of the cyclodisilazane precursor having the Formula I described herein is kept at one or more temperatures for bubbling. In other embodiments, a solution comprising the at least one silicon nitride precursor having the formula described herein is injected into a vaporizer kept at one or more temperatures for direct liquid injection.

A flow of argon, noble, and/or other inert gas may be employed as a carrier gas to help deliver the vapor of the at least one cyclodisilazane precursor to the reaction chamber during the precursor pulsing. In certain embodiments, the reaction chamber process pressure is about 2 Torr or less. In other embodiments, the reaction chamber process pressure is about 10 Torr or less.

In a typical PEALD or PECCVD or PEALD-like process, a substrate such as, without limitation, a silicon oxide, carbon doped silicon oxide, flexible substrate, or metal nitride substrate is heated on a heater stage in a reaction chamber that is exposed to the silicon nitride precursor initially to allow the cyclodisilazane to chemically adsorb onto the surface of the substrate. A purge gas such as nitrogen, argon, or other inert gas purges away unabsorbed excess cyclodisilazane from the process chamber. After sufficient purging, an nitrogen-containing source may be introduced into reaction chamber to react with the absorbed surface followed by another gas purge to remove reaction by-products from the chamber. The process cycle can be repeated to achieve the desired film thickness. In other embodiments, pumping under vacuum can be used to remove unabsorbed excess cyclodisilazane from the process chamber, after sufficient evacuation under pumping, a nitrogen-containing source may be introduced into reaction chamber to react with the absorbed surface followed by another pumping down purge to remove reaction by-products from the chamber.

In one aspect, there is provided a method of forming a silicon nitride film, the method comprising the steps of:
 a. providing a substrate in a reactor;
 b. introducing into the reactor an at least one cyclodisilazane precursor comprising a leaving hydrocarbon group and at least two Si—H groups represented by Formula I below:

wherein R is selected from a branched $C_4$ to $C_{10}$ alkyl group; $R^1$, $R^2$, $R^3$, $R^4$ are each independently selected from a hydrogen atom, a linear or branched $C_1$ to $C_{10}$ alkyl group, a linear or branched $C_3$ to $C_6$ alkenyl group, a linear or branched $C_3$ to $C_6$ alkynyl group, a $C_1$ to $C_6$ dialkylamino group, a $C_6$ to $C_{10}$ aryl group, an electron withdrawing group, a $C_4$ to $C_{10}$ aryl group, and a halide atom, wherein the at least one cyclodisilazane reacts on at least a portion of the surface of the substrate to provide a chemisorbed layer;
 c. purging the reactor with a purge gas;
 d. introducing a plasma containing source into the reactor to react with at least a portion of the chemisorbed layer and provide at least one reactive site wherein the plasma is generated at a power density ranging from about 0.01 to about 1.5 $W/cm^2$; and
 e. optionally purge the reactor with an inert gas; and wherein the steps b through e are repeated until a desired thickness of the silicon nitride film is obtained. A flow of argon, noble, and/or other inert gas may be employed as a carrier gas to help deliver the vapor of the at least one cyclodisilazane precursor to the reaction chamber during the precursor pulsing. In certain embodiments, the reaction chamber process pressure is about 2 Torr or less. In other embodiments, the reaction chamber process pressure is about 10 Torr or less. In certain embodiments of the method, a plasma comprising hydrogen can be inserted before step d to help remove hydrocarbon generated from the reaction between the cyclodisilazane and the surface. The plasma comprising hydrogen is selected from the group consisting of hydrogen plasma, hydrogen/helium, hydrogen/argon plasma, hydrogen/neon plasma and mixtures thereof. In some embodiments, the plasma containing source may be introduced into the reactor in the form of at least one nitrogen source and/or may be present incidentally in the other precursors used in the deposition process. Suitable nitrogen-containing source gases may include, for example, ammonia, hydrazine, monoalkylhydrazine, dialkylhydrazine, nitrogen plasma, nitrogen/hydrogen, nitrogen/helium, nitrogen/argon plasma, ammonia plasma, nitrogen/ammonia plasma, ammonia/helium plasma, ammonia/argon plasma, ammonia/nitrogen plasma, $NF_3$ plasma, organoamine plasma, and mixtures thereof. In other embodiments, the plasma is selected from the group consisting of hydrogen plasma, helium plasma, neon plasma, argon plasma, xenon plasma, hydrogen/helium plasma, hydrogen/argon plasma and mixtures thereof.

In another aspect, there is provided a method of forming a silicon nitride film via plasma enhanced atomic layer deposition process or plasma enhanced ALD-like process, the method comprising the steps of:
 a. providing a substrate in a reactor;
 b. introducing into the reactor at least one cyclodisilazane precursor comprising a leaving hydrocarbon group and at least two Si—H groups is selected from the group consisting of 1,3-bis(tert-butyl)cyclodisilazane, 1,3-bis(tert-butyl)-2-methylcyclodisilazane, 1,3-bis(tert-butyl)-2,4-dimethylcyclodisilazane, 1,3-bis(tert-amyl)cyclodisilazane, 1,3-bis (tert-amyl)-2-methylcyclodisilazane, 1,3-bis(tert-amyl)-2,4-dimethylcyclodisilazane, 1,3-bis(tert-butyl)-2-chloroclodisilazane, 1,3-bis(tert-butyl)-2,4-dichlorocyclodisilazane, 1,3-bis(tert-amyl)-2-chloroclodisilazane, 1,3-bis(tert-amyl)-2,4-dichlorocyclodisilazane, 1,3-bis(tert-butyl)-2,4,4-trilchlorocyclodisilazane, 1,3-bis(tert-butyl)-2-dimethylcyclodisilazane, 1,3-bis(tert-butyl)-2-chloro-2-methylcyclodisilazane, 1,3-bis(tert-amyl)-2-dimethylcyclodisilazane, 1,3-bis(tert-amyl)-2-chloro-2-methyl-cyclodisilazane, 1,3-bis(tert-butyl)-2-vinylcyclodisilazane, 1,3-bis(tert-butyl)-2-ethynyl cyclodisilazane and combinations thereof wherein the at least one cyclodisilazane reacts on at least a portion of the surface of the substrate to provide a chemisorbed layer;

c. purging the reactor with a purge gas comprising at least one selected from nitrogen, a noble gas, and combinations thereof;

d. introducing a plasma containing source into the reactor to react with at least a portion of the chemisorbed layer and provide an at least one reactive site wherein the plasma is generated at a power density ranging from about 0.01 to about 1.5 W/cm$^2$; and e. optionally purge the reactor with an inert gas; and wherein the steps b through e are repeated until a desired thickness of the silicon nitride film is obtained. In some embodiments, the plasma containing source may be introduced into the reactor in the form of at least one nitrogen source and/or may be present incidentally in the other precursors used in the deposition process. Suitable nitrogen-containing source gases may include, for example, ammonia, hydrazine, monoalkylhydrazine, dialkylhydrazine, nitrogen plasma, nitrogen/hydrogen, nitrogen/helium, nitrogen/argon plasma, ammonia plasma, nitrogen/ammonia plasma, ammonia/helium plasma, ammonia/argon plasma, ammonia/nitrogen plasma, NF$_3$ plasma, organoamine plasma, and mixtures thereof. In other embodiments, the plasma is selected from the group consisting of hydrogen plasma, helium plasma, neon plasma, argon plasma, xenon plasma, hydrogen/helium plasma, hydrogen/argon plasma and mixtures thereof.

In another aspect, there is provided a method of forming a silicon aluminum nitride film via plasma enhanced atomic layer deposition process or plasma enhanced ALD-like process, the method comprising the steps of:

a. providing a substrate in a reactor;

b. introducing into the reactor at least one cyclodisilazane precursor comprising a leaving hydrocarbon group and at least two Si—H groups is selected from the group consisting of 1,3-bis(tert-butyl)cyclodisilazane, 1,3-bis(tert-butyl)-2-methylcyclodisilazane, 1,3-bis(tert-butyl)-2,4-dimethylcyclodisilazane, 1,3-bis(tert-amyl)cyclodisilazane, 1,3-bis(tert-amyl)-2-methylcyclodisilazane, 1,3-bis(tert-amyl)-2,4-dimethylcyclodisilazane, 1,3-bis(tert-butyl)-2-chloroclodisilazane, 1,3-bis(tert-butyl)-2,4-dichlorocyclodisilazane, 1,3-bis(tert-amyl)-2-chloroclodisilazane, 1,3-bis(tert-amyl)-2,4-dichlorocyclodisilazane, 1,3-bis(tert-butyl)-2,4,4-trilchlorocyclodisilazane, 1,3-bis(tert-butyl)-2-dimethylcyclodisilazane, 1,3-bis(tert-butyl)-2-chloro-2-methylcyclodisilazane, 1,3-bis(tert-amyl)-2-dimethylcyclodisilazane, 1,3-bis(tert-amyl)-2-chloro-2-methyl-cyclodisilazane, 1,3-bis(tert-butyl)-2-vinylcyclodisilazane, 1,3-bis(tert-butyl)-2-ethynylcyclodisilazane and combinations thereof wherein the at least one cyclodisilazane reacts on at least a portion of the surface of the substrate to provide a chemisorbed layer;

c. purging the reactor with a purge gas comprising at least one selected from nitrogen, a noble gas, and combinations thereof;

d. introducing a plasma containing source into the reactor to react with at least a portion of the chemisorbed layer and provide an at least one reactive site wherein the plasma is generated at a power density ranging from about 0.01 to about 1.5 W/cm$^2$; and e. optionally purge the reactor with an inert gas;

f. introducing into the reactor at least one aluminum precursor is selected from an aluminum precursor selected from the group consisting of AlCl$_3$, trimethylaluminum (TMA), triethylaluminum, tris(dimethylamino)aluminum (TDMAA), tris(dimethylamino)aluminum (TDMAA), and tris(diethylamino)aluminum (TDEAA), and other volatile aluminum precursors;

g. purge the reactor with an inert gas;

h. introducing a plasma containing source into the reactor to react with at least a portion of the chemisorbed layer and provide an at least one reactive site wherein the plasma is generated at a power density ranging from about 0.01 to about 1.5 W/cm$^2$; and i. optionally purge the reactor with an inert gas;

and wherein the steps b through i are repeated until a desired thickness of the silicon aluminum nitride film is obtained. In some embodiment, steps b to e can be repeated many times before step f to create a nanolaminate structure comprising a silicon aluminum nitride with lower aluminum content. In this or another embodiment, steps f to i are repeated many times to create nanolaminate structure comprising silicon aluminum nitride with higher aluminum content. In some embodiments, the plasma containing source may be introduced into the reactor in the form of at least one nitrogen source and/or may be present incidentally in the other precursors used in the deposition process. Suitable nitrogen-containing source gases may include, for example, ammonia, hydrazine, monoalkylhydrazine, dialkylhydrazine, nitrogen plasma, nitrogen/hydrogen, nitrogen/helium, nitrogen/argon plasma, ammonia plasma, nitrogen/ammonia plasma, ammonia/helium plasma, ammonia/argon plasma, ammonia/nitrogen plasma, NF$_3$ plasma, organoamine plasma, and mixtures thereof. In other embodiments, the plasma is selected from the group consisting of hydrogen plasma, helium plasma, neon plasma, argon plasma, xenon plasma, hydrogen/helium plasma, hydrogen/argon plasma and mixtures thereof.

The above steps define one cycle for the method described herein; and the cycle can be repeated until the desired thickness of a silicon nitride film is obtained. In this or other embodiments, it is understood that the steps of the methods described herein may be performed in a variety of orders, may be performed sequentially or concurrently (e.g., during at least a portion of another step), and any combination thereof. The respective step of supplying the precursors and oxygen-containing source may be performed by varying the duration of the time for supplying them to change the stoichiometric composition of the resulting silicon nitride film, although always using nitrogen in less than a stoichiometric amount relative to the available silicon.

In certain embodiments of the method described herein, steps b to e are repeated to provide a silicon nitride film with a thickness ranging from about 0.1 to about 500 Å, or from about 0.1 to about 5 Å, or from about 0.1 to about 10 Å, or about 0.1 to about 50 Å, or 0.1 to about 100 Å. In one particular embodiment of the method described herein, a plasma comprising hydrogen can be inserted before step d to help removing hydrocarbon generated from the reaction between the cyclodisilazane and the surface. The plasma comprising hydrogen is selected from the group consisting of hydrogen plasma, hydrogen/helium, hydrogen/argon plasma, hydrogen/neon plasma and mixtures thereof.

In certain embodiments, the resultant silicon nitride containing films or coatings can be exposed to a post-deposition treatment such as, but not limited to, a plasma treatment, chemical treatment, ultraviolet light exposure, electron beam exposure, and/or other treatments to affect one or more properties of the film. In one particular embodiment of the method described herein, a plasma comprising hydrogen can be employed as post-deposition treatment to the as-deposited silicon nitride film to increase the density as well as decrease the etch rate. The plasma comprising hydrogen is selected from the group consisting of hydrogen plasma, hydrogen/helium, hydrogen/argon plasma, hydrogen/neon plasma and mixtures thereof.

In certain embodiments, the silicon nitride containing films described herein have a dielectric constant of 6 or less. In these or other embodiments, the films can a dielectric constant of about 5 or below, or about 4 or below, or about 3.5 or below as measured by mercury probe technique. However, it is envisioned that films having other dielectric constants (e.g., higher or lower) can be formed depending upon the desired end-use of the film. An example of the silicon containing or silicon nitride film that is formed using the cyclodisilazane precursors and processes described herein has the formulation $Si_xO_yC_zN_vH_w$ wherein Si ranges from about 10% to about 50%; O ranges from about 0% to about 10%; C ranges from about 0% to about 20%; N ranges from about 10% to about 75% or from about 10% to 60%; and H ranges from about 0% to about 10% atomic percent weight % wherein x+y+z+v+w=100 atomic weight percent, as determined for example, by x-ray photoelectron spectroscopy (XPS) or secondary ion mass spectrometry (SIMS).

In one particular embodiment wherein the film is depositing using a plasma comprising a noble gas, the silicon nitride film comprises from about 5% to about 50% carbon atomic weight percent, as determined for example, by XPS or other means. In this particular embodiment, the silicon nitride film further comprises wherein Si ranges from about 10% to about 40%; O ranges from about 0% to about 5%; N ranges from about 10% to about 75% or from about 10% to 50%; and H ranges from about 0% to about 10% atomic percent weight % wherein the total weight percent of the film adds up to 100 atomic weight percent.

As mentioned previously, the method described herein may be used to deposit a silicon nitride film on at least a portion of a substrate. Examples of suitable substrates include but are not limited to, silicon, $SiO_2$, $Si_3N4$, OSG, FSG, silicon carbide, hydrogenated silicon carbide, silicon nitride, hydrogenated silicon nitride, silicon carbonitride, hydrogenated silicon carbonitride, boronitride, antireflective coatings, photoresists, a flexible substrate such as IGZO, organic polymers, porous organic and inorganic materials, metals such as copper and aluminum, and diffusion barrier layers such as but not limited to TiN, Ti(C)N, TaN, Ta(C)N, Ta, W, or WN. The films are compatible with a variety of subsequent processing steps such as, for example, chemical mechanical planarization (CMP) and anisotropic etching processes.

The deposited films have applications, which include, but are not limited to, computer chips, optical devices, magnetic information storages, coatings on a supporting material or substrate, microelectromechanical systems (MEMS), nanoelectromechanical systems, thin film transistor (TFT), light emitting diodes (LED), organic light emitting diodes (OLED), IGZO, and liquid crystal displays (LCD).

The following examples illustrate the method for depositing silicon nitride films described herein and are not intended to limit it in any way the claims appended hereto.

EXAMPLES

In the following examples, unless stated otherwise, properties were obtained from sample films that were deposited onto medium resistivity (14-17 Ω-cm) single crystal silicon wafer substrates. All film depositions were performed using the CN-1 reactor has showerhead design with 13.56 MHz direct plasma. In typical process conditions, unless stated otherwise, the chamber pressure was fixed at a pressure ranging from about 1 to about 5 Torr. Additional inert gas was used to maintain chamber pressure. The aluminum precursor was delivered using vapor draw (i.e. no argon used at all). Typical RF power used was 125 W over electrode area of 150 mm wafer to provide a power density of 0.7 $W/cm^2$. The film depositions comprised the steps listed in Table 1 and 2 for thermal ALD and plasma enhanced ALD, respectively. Steps 1 through 4 in Table 1 constitute one PEALD cycle and were repeated, unless otherwise specified, a total of 300 times to get the desired film thickness.

TABLE 1

| Steps used in PEALD silicon nitride films |
|---|
| Step |
| a   Introduce a cyclodisilazane precursor to the reactor; additional inert gas is used to maintain chamber pressure to provide a chemisorbed layer |
| b   Purge the cyclodisilazane precursor from the reactor chamber with inert gas |
| c   Activate a plasma to react with the surface of the chemisorbed layer and create reactive sites |
| d   Purge unreacted plasma species out |

The reactive index (RI) and thickness for the deposited films were measured using an ellipsometer. Film non-uniformity was calculated using the standard equation: % non uniformity=((max thickness−min thickness)/(2*average (avg) thickness)). Film structure and composition were analyzed using Fourier Transform Infrared (FTIR) spectroscopy and X-Ray Photoelectron Spectroscopy (XPS). The density for the films was measured with X-ray Reflectometry (XRR).

Example 1. Synthesis of
1,3-bis(tert-butyl)cyclodisilazane

To a stirring solution of bis(tert-butylamino)silane (BT-BAS) (200 g, 1.14 mol, 1 eq) in THF (800 mL) and Hexane (600 mL) at −40° C. under inert atmosphere was added 2.5 M solution of BuLi in hexane (637 g, 2.28 mol, 2 eq) slowly to keep the reaction temperature below −30° C. The reaction solution was warmed up to ambient temperature and the solution was collected to a reagent bottle as bis(tert-butylamino)silane dilithium amide. To a stirring solution of THF (500 g) and hexane (500 g) at −40 to −30° C. under inert atmosphere was added the solution of bis(tert-butylamino) silane dilithium amide at a rate 15 g/min and dichlorosilane gas (3.6 ml/sec, total 2560 ml) through a dip tube simultaneously to keep the mole ratio 1:1 of the two reactants in the solution and the temperature below −20° C. The reaction solution was warmed up to room temperature and the solid was filtered off. After solvent was removed and the crude product was purified by reduced pressure (56-7° C./7 mmHg) distillation to give 118.9 g pure product 3 (51.6%). BP: 181° C.; MS: m/z Calcd for $C_8H_{22}N_2Si$; [M], 202; Found, 187 (M-$CH_3$).

Example 2. Synthesis of 1,3-bis(tert-butyl)-2-methylcyclodisilazane

To a stirring solution of bis(tert-butylamino)silane (BT-BAS) (200 g, 1.15 mol, 1 eq) in THF (1400 g) at −40° C. under inert atmosphere was added 2.5 M solution of BuLi in hexane (639 g, 2.3 mol, 2 eq) slowly to keep the reaction temperature below −30° C. After the reaction was complete and the reaction temperature was cooled down to −40° C., the solution of methyldichlorosilane (137 g) in 1237 g hexanes was added to the reaction solution at the speed to keep the temperature below −10° C. The reaction solution was warmed up to room temperature and the solid was filtered off. The solvent was removed and the crude product was purified by reduced pressure distillation (55° C./4 mmHg) to afford 118.1 g pure product 4 (47.6%). MS: m/z Calcd for $C_9H_{24}N_2Si$; [M], 216; Found, 201 (M-$CH_3$).

Example 3. PEALD Silicon Nitride Film Using 1,3-bis(tert-butyl)cyclodisilazane and Nitrogen Plasma The silicon wafer is loaded into the CN-1 reactor equipped with showerhead design with 13.56 MHz direct plasma and heated to 300° C. with chamber pressure of 2 torr. 1,3-bis(tert-butyl)cyclodisilazane as cyclodisilazane precursor is delivered using vapor draw at temperature of 72° C. into the reactor. The ALD cycle is comprised of the process steps provided in Table 1 and uses the following process parameters:
  a. Introduce a cyclodisilazane precursor to the reactor
  Nitrogen flow: 1000 sccm
  Cyclodisilazane precursor pulse: 1 second
  b. Inert gas purge
  Nitrogen flow: 1000 sccm
  Purge time: 10 seconds
  c. Introduce nitrogen plasma
  Nitrogen flow: 1000 sccm
  Nitrogen plasma pulse: 10 second with plasma power of 125 W
  d. Purge
  Nitrogen flow: 1000 sccm
  Purge time: 10 seconds
  Steps a to d were repeated for 500 cycles. The thickness of the as deposited silicon nitride was about 145 Å, corresponding to a growth rate of 0.29 Å/cycle. SIMS composition analysis shows the silicon nitride has Si, 36.22 at %; N, 52.45 at %; C, 1.16 at %; 0, 2.79 at %, and H, 11.32 at %.

Example 4. PEALD Silicon Nitride Film Using 1,3-bis(tert-butyl)cyclodisilazane and Ammonia Plasma The silicon wafer is loaded into the CN-1 reactor equipped with showerhead design with 13.56 MHz direct plasma and heated to 300° C. with chamber pressure of 2 torr. 1,3-bis(tert-butyl)cyclodisilazane as cyclodisilazane precursor is delivered using vapor draw at temperature of 72° C. into the reactor. The ALD cycle is comprised of the process steps provided in Table 1 and uses the following process parameters:
  a. Introduce a cyclodisilazane precursor to the reactor
  Argon flow: 1000 sccm
  Cyclodisilazane precursor pulse: 1 second
  b. Inert gas purge
  Argon flow: 1000 sccm
  Purge time: 10 seconds
  c. Introduce ammonia plasma
  Argon flow: 1000 sccm
  Ammonia flow: 500 sccm
  Plasma pulse: 10 second with plasma power of 125 W
  d. Purge
  Argon flow: 1000 sccm
  Purge time: 10 seconds
  Steps a to d were repeated for 500 cycles. The thickness of the as deposited silicon nitride was about 30 Å, corresponding to a growth rate of 0.06 Å/cycle.

Example 5. PEALD Silicon Nitride Film Using 1,3-bis(tert-butyl)cyclodisilazane and Nitrogen/Ammonia Plasma The silicon wafer is loaded into the CN-1 reactor equipped with showerhead design with 13.56 MHz direct plasma and heated to 300° C. with chamber pressure of 2 torr. 1,3-bis(tert-butyl)cyclodisilazane as cyclodisilazane precursor is delivered using vapor draw at temperature of 72° C. into the reactor. The ALD cycle is comprised of the process steps provided in Table 1 and uses the following process parameters:
  a. Introduce a cyclodisilazane precursor to the reactor
  Argon flow: 1000 sccm
  Cyclodisilazane precursor pulse: 1 second
  b. Inert gas purge
  Argon flow: 1000 sccm
  Purge time: 10 seconds
  c. Introduce ammonia plasma
  Argon flow: 1000 sccm
  Ammonia flow: 250 sccm
  Nitrogen flow: 250 sccm
  Plasma pulse: 10 second with plasma power of 125 W
  d. Purge
  Argon flow: 1000 sccm
  Purge time: 10 seconds
  Steps a to d were repeated for 500 cycles. The thickness of the as deposited silicon nitride was about 40 Å, corresponding to a growth rate of 0.08 Å/cycle.

Figure 1:
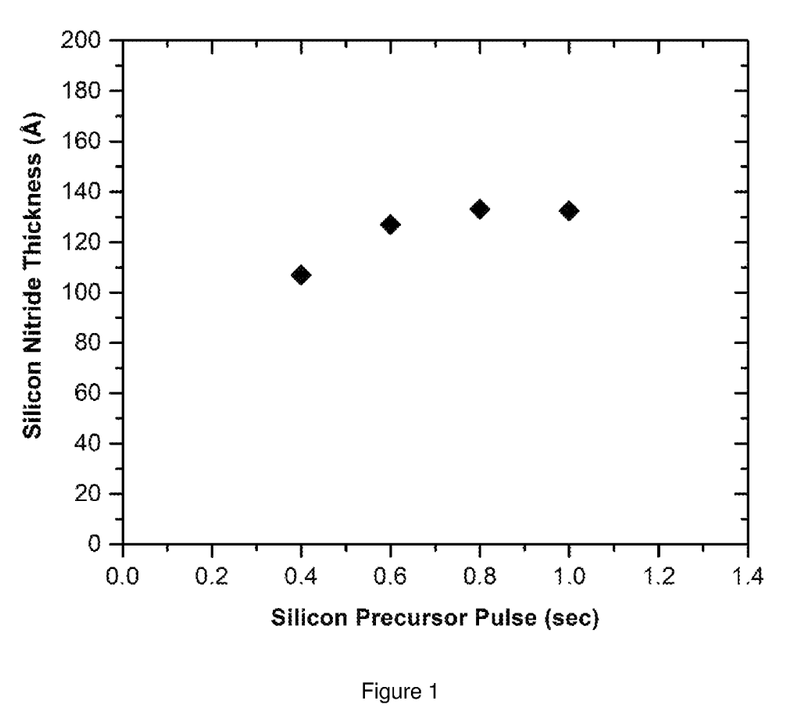
FIG. 1 provides the relationship between the thickness of deposited silicon nitride films measured in Å and silicon precursor pulse time (measured in seconds) for the cyclodisilazane precursor and method described in Example 6.
Figure 2:
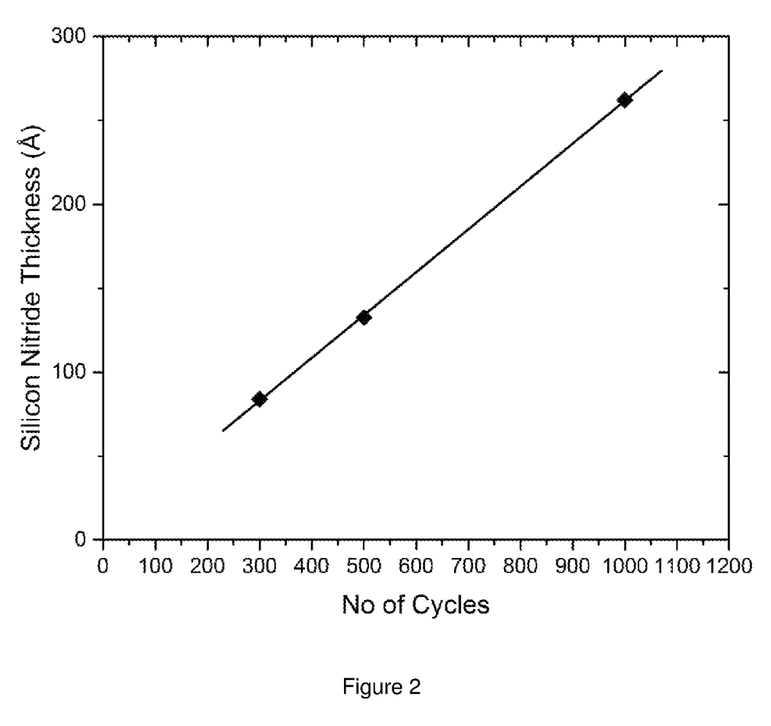
FIG. 2 provides the silicon nitride film thickness measured in Å versus the number of cycles using the cyclodisilazane precursor and nitrogen plasma at 300° C. described in Example 6.

Example 6. PEALD Silicon Nitride Film Using 1,3-bis(tert-butyl)-2-methylcyclodisilazane and Nitrogen Plasma The silicon wafer is loaded into the CN-1 reactor equipped with showerhead design with 13.56 MHz direct plasma and heated to 300° C. with chamber pressure of 2 torr. The cyclodisilazane precursor 1,3-bis(tert-butyl)-2-methylcyclodisilazane is delivered using vapor draw at temperature of 80° C. into the reactor. The ALD cycle comprises the process steps provided in Table 1 and uses the following process parameters:
  a. Introduce a cyclodisilazane precursor to the reactor
  Nitrogen flow: 1000 sccm
  Cyclodisilazane precursor pulse: varying from 0.4 to 1 second
  b. Inert gas purge
  Nitrogen flow: 1000 sccm
  Purge time: 10 seconds c. Introduce nitrogen plasma
Nitrogen flow: 1000 sccm
Nitrogen plasma pulse: 10 second with plasma power of 125 W
d. Purge
Nitrogen: 1000 sccm
Purge time: 10 seconds Steps a to d were repeated for 500 cycles. The thickness of the as deposited silicon nitride was about 107 Å to 133 Å (see FIG. 1). Referring now to FIG. 1, FIG. 1 shows the silicon nitride film thickness of as-deposited silicon nitride vs pulse time of 1,3-bis(tert-butyl)-2-methylcyclodisilazane using nitrogen plasma at 300° C., demonstrating the self-limiting behavior at 0.8 s. SIMS analysis the silicon nitride deposited with 1 second of cyclodisilazane precursor pulse shows the composition: Si, 33.88 at %; N, 50.50 at %; C, 1.60 at %; 0, 3.03 at %, and H, 10.98 at %. Referring now to FIG. 2, FIG. 2 shows the silicon nitride thickness vs the number of cycles for 1 second of cyclodisilazane precursor pulse, suggesting the growth rate of 0.26 Å/cycle. The wet etch rate in diluted HF for silicon nitride deposited with 1 second of cyclodisilazane precursor pulse is about 0.7 related thermal silicon oxide and 2.53 related to thermal silicon nitride under the same etch conditions.

Example 7. PEALD Silicon Nitride Film Using 1,3-bis(tert-butyl)-2-methylcyclodisilazane and Ammonia Plasma The silicon wafer is loaded into the CN-1 reactor equipped with showerhead design with 13.56 MHz direct plasma and heated to 300° C. with chamber pressure of 2 torr. 1,3-bis(tert-butyl)-2-methylcyclodisilazane as cyclodisilazane precursor is delivered using vapor draw at temperature of 80° C. into the reactor. The ALD cycle is comprised of the process steps provided in Table 1 and uses the following process parameters:
a. Introduce a cyclodisilazane precursor to the reactor
Argon flow: 1000 sccm
Cyclodisilazane precursor pulse: 1 second
b. Inert gas purge
Argon flow: 1000 sccm
Purge time: 10 seconds
c. Introduce ammonia plasma
Argon flow: 1000 sccm
Ammonia flow: 500 sccm
Plasma pulse: 10 second with plasma power of 125 W
d. Purge
Argon flow: 1000 sccm
Purge time: 10 seconds Steps a to d were repeated for 500 cycles. The thickness of the as deposited silicon nitride was about 30 Å, corresponding to a growth rate of 0.06 Å/cycle.

While the invention has been described with reference to certain embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:
1. A method of forming a silicon nitride film onto at least a surface of a substrate, the method comprising
   a. providing a substrate in a reactor;
   b. introducing into the reactor a cyclodisilazane precursor comprising a leaving hydrocarbon group and at least two Si—H groups and selected from the group consisting of 1,3-bis(tert-butyl)cyclodisilazane, 1,3-bis(tert-butyl)-2-methylcyclodisilazane, 1,3-bis(tert-butyl)-2,4-dimethylcyclodisilazane, 1,3-bis(tert-amyl)cyclodisilazane, 1,3-bis(tert-amyl)-2-methylcyclodisilazane, 1,3-bis(tert-amyl)-2,4-dimethylcyclodisilazane, 1,3-bis(tert-butyl)-2-chloroclodisilazane, 1,3-bis(tert-butyl)-2,4-dichlorocyclodisilazane, 1,3-bis(tert-amyl)-2-chloroclodisilazane, 1,3-bis(tert-amyl)-2,4-dichlorocyclodisilazane, 1,3-bis(tert-butyl)-2,4,4-trilchlorocyclodisilazane, 1,3-bis(tert-butyl)-2-dimethylcyclodisilazane, 1,3-bis(tert-butyl)-2-chloro-2-methylcyclodisilazane, 1,3-bis(tert-amyl)-2-dimethylcyclodisilazane, 1,3-bis(tert-amyl)-2-chloro-2-methyl-cyclodisilazane, 1,3-bis(tert-butyl)-2-vinylcyclodisilazane, 1,3-bis(tert-butyl)-2-ethynylcyclodisilazane and combinations thereof, wherein the at least one cyclodisilazane reacts on at least a portion of the surface of the substrate to provide a chemisorbed layer;
   c. purging the reactor with a purge gas;
   d. introducing a plasma containing source and an inert gas into the reactor to react with at least a portion of the chemisorbed layer and provide at least one reactive site wherein the plasma is generated at a power density ranging from about 0.01 to about 1.5 W/cm$^2$; and
   e. optionally purging the reactor with an inert gas; and wherein the steps b through e are repeated until a desired thickness of the silicon nitride film is obtained.

2. The method of claim 1 the plasma containing source is selected from the group consisting of a nitrogen/argon plasma, ammonia plasma, nitrogen/ammonia plasma, ammonia/helium plasma, ammonia/argon plasma, ammonia/nitrogen plasma, NF$_3$ plasma, organoamine plasma, and mixtures thereof.

3. The method of claim 1 wherein the silicon nitride film has a density of 2.2 g/cc or greater.

4. The method of claim 1 wherein the method is a vapor deposition process and is selected from the group consisting of at least one selected from plasma enhanced chemical vapor deposition and plasma enhanced cyclic chemical vapor deposition.

5. The method of claim 1 wherein the method is conducted at one or more temperatures of about 400° C. or less.

6. The method of claim 1 wherein the method is conducted at one or more temperatures of about 300° C. or less.

7. The method of claim 1 wherein step b further comprises introducing a noble gas into the reactor.

8. A method of forming a silicon nitride film onto at least a surface of a substrate, the method comprising the steps of:
   a. providing a substrate in a reactor;
   b. introducing into the reactor at least one cyclodisilazane precursor selected from the group consisting of 1,3-bis(tert-butyl)cyclodisilazane, 1,3-bis(tert-butyl)-2-methylcyclodisilazane, 1,3-bis(tert-butyl)-2,4-dimethylcyclodisilazane, 1,3-bis(tert-amyl)cyclodisilazane, 1,3-bis(tert-amyl)-2-methylcyclodisilazane, 1,3-bis(tert-amyl)-2,4-dimethylcyclodisilazane, 1,3-bis(tert-butyl)-2-chloroclodisilazane, 1,3-bis(tert-butyl)-2,4-dichlorocyclodisilazane, 1,3-bis(tert-amyl)-2- chloroclodisilazane, 1,3-bis(tert-amyl)-2,4-dichlorocyclodisilazane, 1,3-bis(tert-butyl)-2,4,4-trilchlorocyclodisilazane, 1,3-bis(tert-butyl)-2-dimethylcyclodisilazane, 1,3-bis(tert-butyl)-2-chloro-2-methylcyclodisilazane, 1,3-bis(tert-amyl)-2-dimethylcyclodisilazane, 1,3-bis(tert-amyl)-2-chloro-2-methyl-cyclodisilazane, 1,3-bis(tert-butyl)-2-vinylcyclodisilazane, 1,3-bis(tert-butyl)-2-ethynylcyclodisilazane and combinations thereof wherein the at least one cyclodisilazane reacts on at least a portion of the surface of the substrate to provide a chemisorbed layer;

c. purging the reactor with a purge gas comprising at least one selected from nitrogen, a noble gas, and combinations thereof;

d. introducing a plasma containing source into the reactor to react with at least a portion of the chemisorbed layer and provide an at least one reactive site wherein the plasma is generated at a power density ranging from about 0.01 to about 1.5 W/cm$^2$; and e. optionally purge the reactor with an inert gas; and wherein the steps b through e are repeated until a desired thickness of the silicon nitride film is obtained.

9. The method of claim 8 wherein the silicon nitride film has a density of 2.2 g/cc or greater.

10. The method of claim 8 wherein method is a vapor deposition process selected from the group consisting of plasma enhanced chemical vapor deposition and plasma enhanced cyclic chemical vapor deposition.

11. The method of claim 8 wherein the method is conducted at a temperature of 400° C. or less.

12. The method of claim 8 wherein the method is conducted at a temperature of 300° C. or less.

13. The method of claim 8 where the plasma containing source is selected from the group consisting of a nitrogen/argon plasma, ammonia plasma, nitrogen/ammonia plasma, ammonia/helium plasma, ammonia/argon plasma, ammonia/nitrogen plasma, NF$_3$ plasma, organoamine plasma, and mixtures thereof.

14. The method of claim 8 wherein step b further comprises introducing a noble gas into the reactor.

15. The method of claim 8 wherein a plasma comprising hydrogen can be inserted before step d to help remove hydrocarbon generated from the reaction between the cyclodisilazane and the surface.

16. The method of claim 15 wherein the plasma comprising hydrogen is selected from the group consisting of hydrogen plasma, hydrogen/helium, hydrogen/argon plasma, hydrogen/neon plasma and mixtures thereof.

17. A method of forming a silicon aluminum nitride film onto at least a surface of a substrate, the method comprising the steps of:

a. providing a substrate in a reactor;

b. introducing into the reactor at least one cyclodisilazane precursor selected from the group consisting of 1,3-bis(tert-butyl)cyclodisilazane, 1,3-bis(tert-butyl)-2-methylcyclodisilazane, 1,3-bis(tert-butyl)-2,4-dimethylcyclodisilazane, 1,3-bis(tert-amyl)cyclodisilazane, 1,3-bis(tert-amyl)-2-methylcyclodisilazane, 1,3-bis(tert-amyl)-2,4-dimethylcyclodisilazane, 1,3-bis(tert-butyl)-2-chloroclodisilazane, 1,3-bis(tert-butyl)-2,4-dichlorocyclodisilazane, 1,3-bis(tert-amyl)-2-chloroclodisilazane, 1,3-bis(tert-amyl)-2,4-dichlorocyclodisilazane, 1,3-bis(tert-butyl)-2,4,4-trilchlorocyclodisilazane, 1,3-bis(tert-butyl)-2-dimethylcyclodisilazane, 1,3-bis(tert-butyl)-2-chloro-2-methylcyclodisilazane, 1,3-bis(tert-amyl)-2-dimethylcyclodisilazane, 1,3-bis(tert-amyl)-2-chloro-2-methyl-cyclodisilazane, 1,3-bis(tert-butyl)-2-vinylcyclodisilazane, 1,3-bis(tert-butyl)-2-ethynyl cyclodisilazane and combinations thereof wherein the at least one cyclodisilazane reacts on at least a portion of the surface of the substrate to provide a chemisorbed layer;

c. purging the reactor with a purge gas comprising at least one selected from nitrogen, a noble gas, and combinations thereof;

d. introducing a first plasma containing source into the reactor to react with at least a portion of the chemisorbed layer and provide an at least one reactive site wherein the plasma is generated at a power density ranging from about 0.01 to about 1.5 W/cm$^2$; and e. optionally purging the reactor with an inert gas;

f) introducing into the reactor at least one aluminum precursor selected from the group consisting of AlCl$_3$, trimethylaluminum, triethylaluminum, and tris(dimethylamino)aluminum, g) purging the reactor using inert gas, h) introducing a second plasma containing source into the reactor wherein the plasma is generated at a power density ranging from about 0.01 to about 1.5 W/cm$^2$, and i) optionally purging the reactor using inert gas, wherein the steps b through i are repeated until a desired thickness of the silicon aluminum nitride film is obtained.

18. The method of claim 17 wherein the silicon aluminum nitride film has a density of 2.2 g/cc or greater.

19. The method of claim 17 wherein method is a vapor deposition process selected from the group consisting of at least one selected from plasma enhanced chemical vapor deposition and plasma enhanced cyclic chemical vapor deposition.

20. The method of claim 17 wherein the method is conducted at a temperature of 400° C. or less.

21. The method of claim 17 wherein each of the plasma containing sources is individually selected from the group consisting of a nitrogen/argon plasma, ammonia plasma, nitrogen/ammonia plasma, ammonia/helium plasma, ammonia/argon plasma, ammonia/nitrogen plasma, NF$_3$ plasma, organoamine plasma, and mixtures thereof.

* * * * *